United States Patent
Kumamoto

(10) Patent No.: US 8,196,445 B2
(45) Date of Patent: Jun. 12, 2012

(54) LEAD FORMING APPARATUS AND METHOD OF FABRICATING SEMICONDUCTOR DEVICE

(75) Inventor: Tooru Kumamoto, Kumamoto (JP)

(73) Assignee: Renesas Electronics Corporation, Kanagawa (JP)

( * ) Notice: Subject to any disclaimer, the term of this patent is extended or adjusted under 35 U.S.C. 154(b) by 906 days.

(21) Appl. No.: 12/244,296

(22) Filed: Oct. 2, 2008

(65) Prior Publication Data
US 2009/0093086 A1    Apr. 9, 2009

(30) Foreign Application Priority Data
Oct. 3, 2007   (JP) ................................ 2007-260237

(51) Int. Cl.
*B21D 31/00*    (2006.01)
*H01R 43/04*    (2006.01)
*B23P 19/00*    (2006.01)
*B21F 1/00*     (2006.01)

(52) U.S. Cl. ............ 72/379.2; 29/882; 29/753; 29/761; 140/105

(58) Field of Classification Search .......... 257/E23.031, 257/E21.499, 696, 735; 438/110, 111, 121, 438/123, 611; 140/105, 106; 29/566.3, 731, 29/844, 882, 751, 753, 761; 72/31.1, 31.11, 72/324, 379.2
See application file for complete search history.

(56) References Cited

U.S. PATENT DOCUMENTS

| | | | | |
|---|---|---|---|---|
| 3,796,201 A | * | 3/1974 | Golub | 140/105 |
| 4,907,628 A | * | 3/1990 | Corey et al. | 140/105 |
| 5,105,857 A | * | 4/1992 | Ellis | 140/105 |
| 5,251,679 A | | 10/1993 | Schweizer | |
| 5,410,804 A | * | 5/1995 | Berendts | 438/111 |

FOREIGN PATENT DOCUMENTS

| | | |
|---|---|---|
| JP | 2-87561 | 3/1990 |
| JP | 5-206213 | 8/1993 |
| JP | 8-23060 | 1/1996 |
| JP | 8-102513 | 4/1996 |
| JP | 2001-168257 | 6/2001 |

OTHER PUBLICATIONS

Japanese Notification of Reasons for Refusal dated Aug. 9, 2011 in corresponding Japanese No. 2007-260237 with partial English translation of Japanese Notification of Reasons for Refusal.

* cited by examiner

*Primary Examiner* — Teresa Ekiert
(74) *Attorney, Agent, or Firm* — Young & Thompson

(57) ABSTRACT

A lead forming apparatus has a function of bending leads of a semiconductor device having leads into a gull wing shape. The lead forming apparatus includes: a lead bending die, as a lower die, allowing thereon placement of the semiconductor device and accepting the leads in the bending leads; a lead bending punch, as an upper die, descending towards the lead bending die so as to move the leads of the semiconductor device towards the lead bending die, to thereby bend the leads into a gull wing shape; and a first stopper specifying the bottom dead center of the lead bending punch, so as to ensure a distance not smaller than thickness of the leads between the bottom surface of the lead bending punch and the top surface of a portion, allowing thereon placement of the leads, of the lead bending die.

13 Claims, 17 Drawing Sheets

BEFORE

AFTER

LEAD FORMING APPARATUS AND METHOD OF FABRICATING SEMICONDUCTOR DEVICE

This application is based on Japanese patent application No. 2007-260237 the content of which is incorporated hereinto by reference.

BACKGROUND

1. Technical Field

The present invention relates to a lead forming apparatus and a method of fabricating a semiconductor device.

2. Related Art

In a method of manufacturing a semiconductor device having a plurality of outer leads in the outer periphery of a molding resin encapsulating a semiconductor chip, the semiconductor chip is placed on a lead frame and then encapsulated with a resin, the product is then subjected to processes including flash removal of the molding resin, solder plating and so forth, and finally subjected to finishing of leads (referred to as "lead forming", hereinafter).

The lead forming process of semiconductor device includes cutting leads to separate a semiconductor device from a lead frame, bending leads (outer leads) into a predetermined geometry, and cutting the ends of leads so as to adjust them to a specified dimension. As for semiconductor devices of the surface mounting type, the leads are formed into a gull wing shape characterized by horizontal projection, followed by downward bending, and again by horizontal bending, and so as to have a predetermined dimension of leads.

A technique of carrying out these procedures of lead forming in a single step has recently been developed.

Japanese Laid-Open Patent Publication No. 2001-168257 describes a die capable of bending, and then cutting, the outer leads of a lead frame in a single stroke. Japanese Laid-Open Patent Publication No. H8-23060 describes a method of cutting leads by which the ends of leads are cut while adjusting them to a predetermined length, and the leads are then bent in a Z-form, characterized in that the leads are cut just as being torn off by a pressing force of a lead forming punch struck thereon, and that the leads are bent by completely pressing them to a bending component.

Japanese Laid-Open Patent Publication No. H2-87561 describes a die capable of forming leads of a semiconductor device placed on a forming die, which is used as a lower die, by pressurizing them with a forming punch, which is used as an upper die.

Holding of the leads with the dies in the process of lead bending may, however, cause scratches or peeling of solder plating of the leads, and this may cause abnormal appearance of the semiconductor device, may cause contact failure in the process of mounting of the semiconductor device, may degrade quality of the semiconductor device due to adhesion of fallen debris onto the surface of the leads, may cause abnormal appearance of the semiconductor device or degradation in strength of the leads, due to residence or deposition of fallen debris in the dies, and consequent excessive pressure locally exerted when the leads are held.

Japanese Laid-Open Patent Publication No. H8-102513 describes a configuration of the die shaped so as to scarcely contact with the work to be processed in the portion thereof not subjected to bending, and having, at the upper portion thereof, a deposition guiding surface composed of a curved surface continued from the bending surface, and a hole discharging deposits therethrough. The configuration is reportedly capable of largely reducing production of the debris of plating, and of thereby preventing failures such as inter-lead short circuiting.

These conventional techniques have, however, been suffering from the problems below:

(1) the leads are formed into the same geometry with the dies, because the leads in the process of bending are clamped between the dies, without a function of adjusting geometry and dimension of the leads; and (2) the dies are necessarily formed in the same geometry with the leads because the leads in the process of bending are held between the dies, thereby the die components may require complicated and precision machining, period of manufacture and delivery thereof may become longer, and cost for the manufacture may increase.

SUMMARY

According to the present invention, there is provided a lead forming apparatus having a function of bending leads of a semiconductor device having leads into a gull wing shape. The lead forming apparatus includes:

a lead bending die, as a lower die, allowing thereon placement of the semiconductor device and accepting the leads in bending the leads;

a lead bending punch, as an upper die, descending towards the lead bending die so as to move the leads of the semiconductor device towards the lead bending die, to thereby bend the leads into a gull wing shape; and a first stopper specifying the bottom dead center of the lead bending punch, so as to ensure a distance not smaller than thickness of the leads between the bottom surface of the lead bending punch and the top surface of a portion, allowing thereon placement of the leads, of the lead bending die.

According to the present invention, there is provided a method of fabricating a semiconductor device having a plurality of leads including:

descending a lead bending punch, as an upper die, towards a lead bending die, as an lower die, so as to move the leads of the semiconductor device towards the lead bending die, to thereby bend the leads into a gull wing shape, wherein, in descending a lead bending punch, the bottom dead center of the lead bending punch is specified so as to ensure distance not smaller than thickness of the leads, between the bottom surface of the lead bending punch and the top surface of a portion, allowing thereon placement of the leads, of the lead bending die.

In short, the lead forming apparatus of the present invention is configured as having a mechanism of adjusting the bottom dead center of the lead bending punch, and as ensuring, at the bottom dead center of the lead bending punch, a gap not smaller than thickness of the leads, between the bottom surface of the lead bending punch and the top surface of the lead bending die. By virtue of this configuration of the present invention, the leads may be formed in the process of bending leads while allowing the lead bending punch to stop at the bottom dead center where the leads are never bitten. The position of the bottom dead center of the lead bending punch is arbitrarily adjustable by appropriately setting height of the first stopper. Therefore, according to the present invention, the lead geometry, mainly angle of flatness of lead and so forth, is readily adjustable and modifiable without manufacturing nor exchanging die components (punches and dies). The present invention can also reduce area of contact of the leads with the lead bending punch and the lead bending die, and can prevent scratching or peeling of the solder plated surface of the leads. The thickness of the leads herein may be defined as thickness including thickness of the solder plating.

According to the present invention, the leads may readily be formed into a desired geometry, and scratching or peeling of solder plating may be prevented in the process of bending leads.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
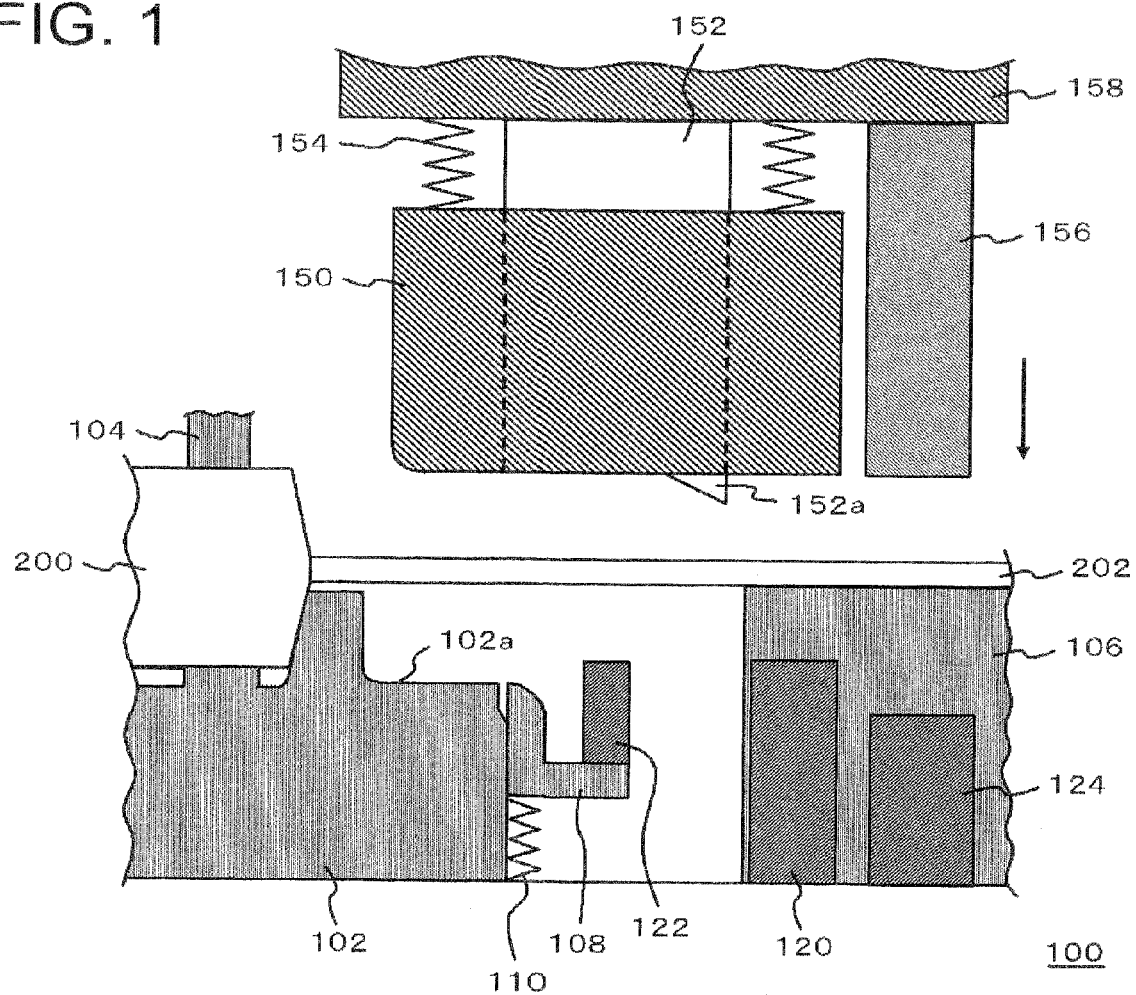
FIG. 1 to FIG. 5 are side elevations schematically showing a configuration of a lead forming apparatus in one embodiment of the present invention.

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

Embodiments of the present invention will be explained below, referring to the attached drawings. It is to be understood that, in all drawings, any similar constituents will be given with similar reference numerals, so as to avoid repetitive explanation.

Figure 16A:
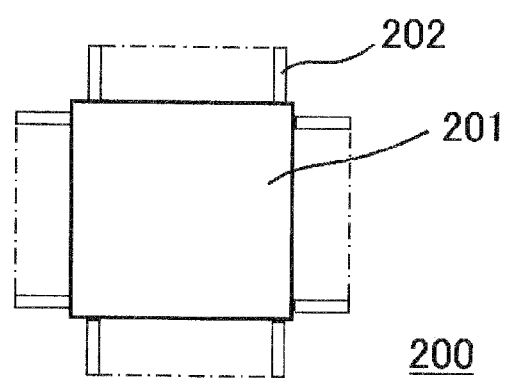
FIGS. 16A and 16B are schematic drawings showing an exemplary semiconductor device handled in the embodiments of the present invention.
Figure 16B:
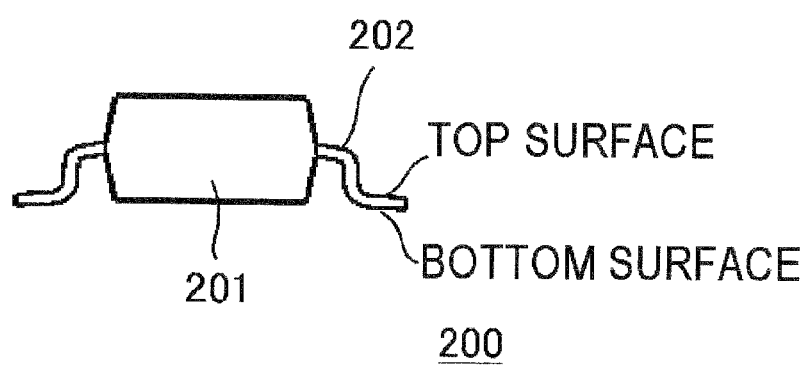

FIGS. 16A and 16B are schematic drawings showing an exemplary semiconductor device handled in the embodiments of the present invention. FIG. 16A is a plan view of a semiconductor device 200, and FIG. 16B is a side elevation of the semiconductor device 200.

A plurality of outer leads (simply referred to as "leads", hereinafter) 202 are provided on the side faces of a molding resin 201 encapsulating a semiconductor chip. For example, the thickness of the leads 202 is 0.125 to 0.150 mm (millimeter), and the width is approximately 0.2 mm. The top surface, the bottom surface and the side faces of the leads 202 are provided with a plated film. The "thickness of the leads" described hereinafter is defined as including thickness of the plated film.

The lead forming apparatus in this embodiment of the present invention can successively execute three steps of:

(1) cutting leads to separate the semiconductor device 200 from a lead frame;

(2) bending leads into a gull wing shape; and (3) cutting the ends of leads so as to adjust them to a specified dimension.

Figure 17A:
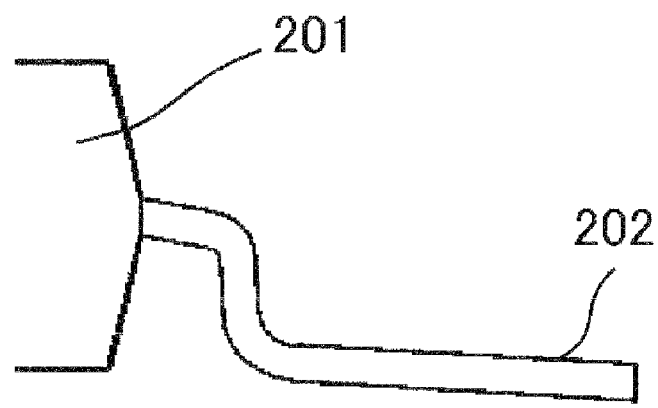
FIGS. 17A and 17B are enlarged views of the lead portion of the semiconductor device shown in FIG. 16B.
Figure 17B:
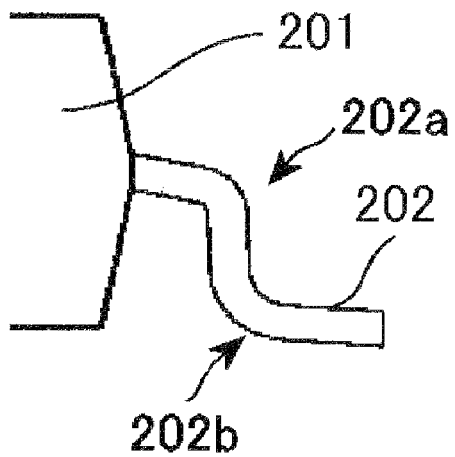

FIGS. 17A and 17B are enlarged views of the lead 202 portion of the semiconductor device 200 shown in FIG. 16B.

FIG. 17A shows a state before the ends of leads are cut off, and FIG. 17B shows a state after the ends of leads are cut off. In the embodiments below, the leads 202 are formed into a gull wing shape having a first bent portion 202a and a second bent portion 202b.

First Embodiment

FIG. 1 is a side elevation schematically showing a configuration of a lead forming apparatus 100 in this embodiment. FIG. 1 shows an initial state in which the semiconductor device 200 having the leads 202 is disposed in the lead forming apparatus 100. The lead forming apparatus 100 herein is composed of dies.

The lead forming apparatus 100 contains a first lead bending die 102, a supporting component 104, a lead rest 106, a second lead bending die 108, first stoppers 120, second stoppers 122, and third stoppers 124. These components are provided as composing a lower die of the lead forming apparatus 100. Between the second lead bending die 108 and the base plane of the lower die, a first spring 110 is provided. The lead forming apparatus 100 may include a plurality of first springs 110. The first spring 110 may be configured as having a withstand load sufficiently durable against load expected when the second lead bending die 108 accepts the leads. In the initial state, the second lead bending die 108 is pushed up by the first spring 110, so as to align the top surface thereof at the same level of height with the top surface of the lead bending portion 102a of the first lead bending die 102.

The lead forming apparatus 100 further contains an upper die base 158, a lead bending punch 150 attached to the upper die base 158, a lead cutting punch 152, and fourth stoppers 156. These components are provided as composing an upper die of the lead forming apparatus 100. The upper die base 158 shown in FIG. 1 is held as being ascended. The lead bending punch 150 is hung down from the upper die base 158 with the aid of a plurality of sliding components (not shown), so as to allow vertical sliding in a highly precise manner. Between the lead bending punch 150 and the upper die base 158, second springs 154 are provided. The second springs 154 may be configured as having a withstand load sufficiently durable against load expected when the leads 202 of the semiconductor device 200 are bent by the lead bending punch 150. In the initial state, the lead bending punch 150 is pressed down by the second springs 154 and is allowed to stay still there in a highly precise manner, while aligning the bottom surface of the lead bending punch 150 and the bottom surface, but excluding an acute-angled portion 152a, of the lead cutting punch 152 to the same level of height.

The first lead bending die 102, the lead rest 106, the first spring 110, the first stoppers 120, and the third stoppers 124 are fixed to the base plane of the lower die. On the other hand, the supporting component 104, the second lead bending die 108, and the upper die base 158 are movable in the vertical direction. The second stoppers 122 are disposed on the second lead bending die 108, and are movable in the vertical direction together with the second lead bending die 108. The second lead bending die 108 has an "L" shape, in a side view, including a horizontal portion on which the second stoppers 122 are placed and a vertical portion that includes a round portion as will be described later. Also the lead bending punch 150, the lead cutting punch 152, the second springs 154 and the fourth stoppers 156 attached to the upper die base 158 are movable in the vertical direction together with the upper die base 158.

As for the second lead bending die 108 and the second stoppers 122, positions shown in the drawing are the initial standby positions. The supporting component 104, the upper die base 158, and the lead bending punch 150, the lead cutting punch 152, the second springs 154 and the fourth stoppers 156 attached to the upper die base 158 are initially kept standby at the position vertically higher than that shown in the drawing, and are allowed to descend down to the position shown in the drawing, after the semiconductor device 200 is placed on the first lead bending die 102, and kept standby for forming leads. At this time, the lead rest 106 supports the bottom surface of the leads 202.

In this embodiment, the lead cutting punch 152 has two functions of (1) cutting and separating the leads 202 from a lead frame (not shown), and (2) cutting and removing the ends of leads 202 so as to adjust them to a specified dimension after bending the leads 202. The lead cutting punch 152 is shaped as having right angles at the cutting edge closer to the main body of the semiconductor device 200, as shown on the left in the drawing, and as having an acute angle at the cutting edge (acute-angled portion 152a) closer to the lead frame, as shown on the right in the drawing. When cutting and separating the leads 202 from the lead frame, the edge of the lead rest 106 facing to the lead cutting punch 152 plays a role of a cutting edge. When cutting and removing the ends of leads 202, the edge of the first lead bending die 102 facing to the lead cutting punch 152 plays a role of a cutting edge.

Geometry of the lead cutting punch 152 may be configured so as to avoid contact between the lead cutting punch 152 and the leads 202, over the period from the point of time immediately after completion of cutting and separating the leads 202 from the lead frame at the lead frame side, up to start of cutting and removing the ends of leads 202 at the main body side. Without departing from the scope of these purposes, the geometry of the lead cutting punch 152 is not limited to that shown in the drawing.

Figure 6A:
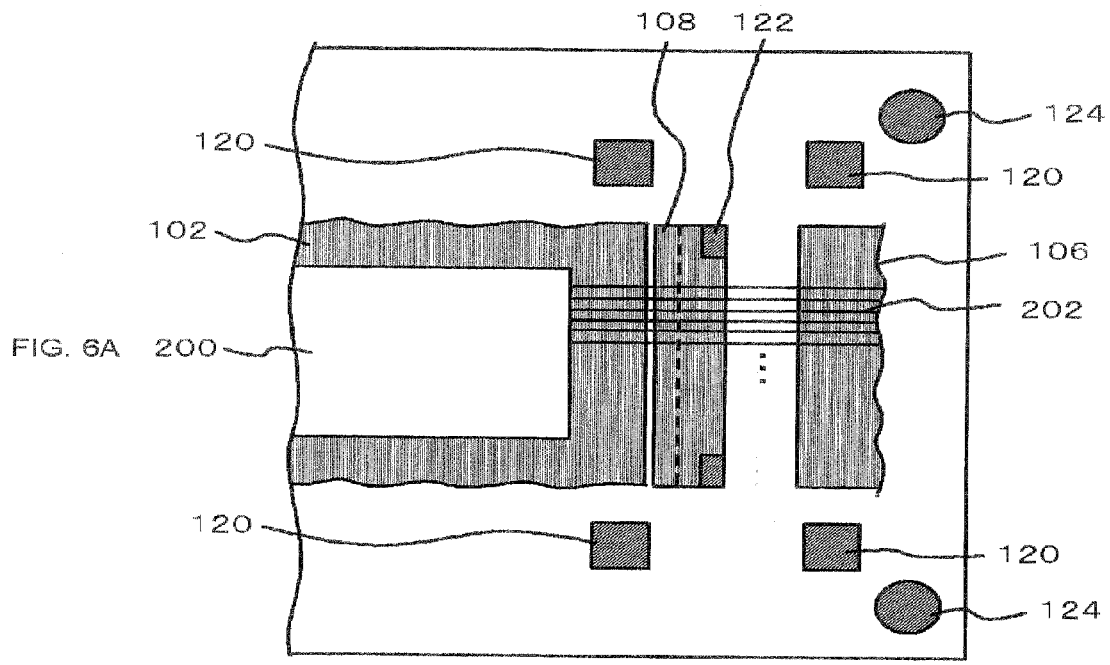
FIGS. 6A and 6B are plan views schematically showing a configuration of the lead forming apparatus.
Figure 6B:
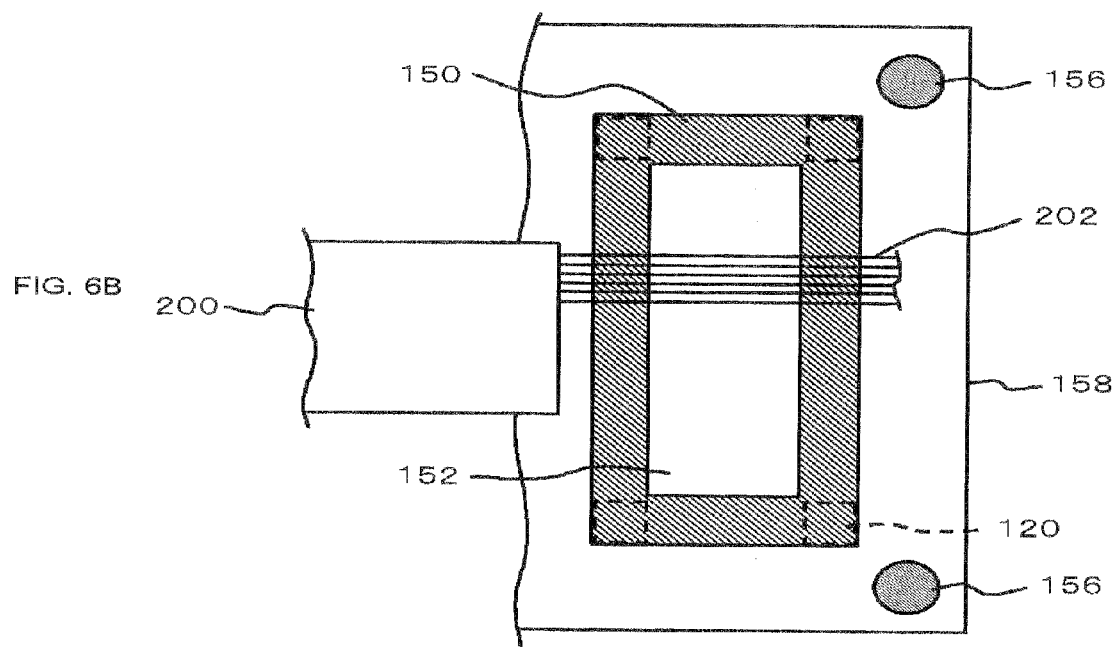

FIGS. 6A and 6B are plan views schematically showing a configuration of the lead forming apparatus 100.

FIG. 6A is a plan view schematically showing a configuration of the lower die of the lead forming apparatus 100 in the initial state. In this state, the semiconductor device 200 is still in connection with the lead frame (not shown). The second stoppers 122 are provided to a portion on the second lead bending die 108. The first stoppers 120 and the third stoppers 124 are provided around the position where the second lead bending die 108 and the lead rest 106 are provided.

FIG. 6B is a plan view schematically showing a configuration of the upper die of the lead forming apparatus 100 in the initial state. The fourth stoppers 156 are provided at positions corresponded to the third stoppers 124 of the lower die. The lead cutting punch 152 is housed in a hollow space of the lead bending punch 150. The lead bending punch 150 is provided so that the four corners thereof may correspond, in a plan view, to the first stoppers 120 of the lower die. The lead cutting punch 152 is provided in the space, in a plan view, between the side face of the first lead bending die 102 and the side face of the lead rest 106.

Next, a more detailed configuration of the lead forming apparatus 100, and procedures of lead forming using the lead forming apparatus 100 will be explained, referring to FIG. 1 to FIG. 5.

As shown in FIG. 1, the main body of the semiconductor device 200 (a portion corresponded to the molding resin 201 shown in FIGS. 16A and 16B) is placed on the first lead bending die 102, while being accepted and positioned on the bottom surface and the side oblique surfaces thereof. By virtue of this configuration, cutting position in the process of cutting and removing the ends of leads 202, described later, can be determined. The top surface of the lead rest 106 is positioned at the level of height where the leads 202 are laid in the initial state.

The supporting component 104 functions as supporting the main body of the semiconductor device 200 so as to prevent it from floating up above the first lead bending die 102, due to reaction force applied in the process of bending or cutting of the leads 202. After the main body of the semiconductor device 200 is placed on the first lead bending die 102, the supporting component 104 descends from above so as to support the top surface of the semiconductor device 200. The supporting component 104 holds the semiconductor device 200 against the reaction force which tends to push up the main body of the semiconductor device 200 in the process of bending the leads 202, by either of two methods of (1) applying load larger than the reaction force, and (2) applying no load to the main body of the semiconductor device 200, while keeping the supporting component 104 stopped and fixed at the position of the top surface of the semiconductor device 200. For the case of applying the method (1), the minimum load exceeding the reaction force may be set so as to minimize stress exerted to the semiconductor device 200.

Figure 2:
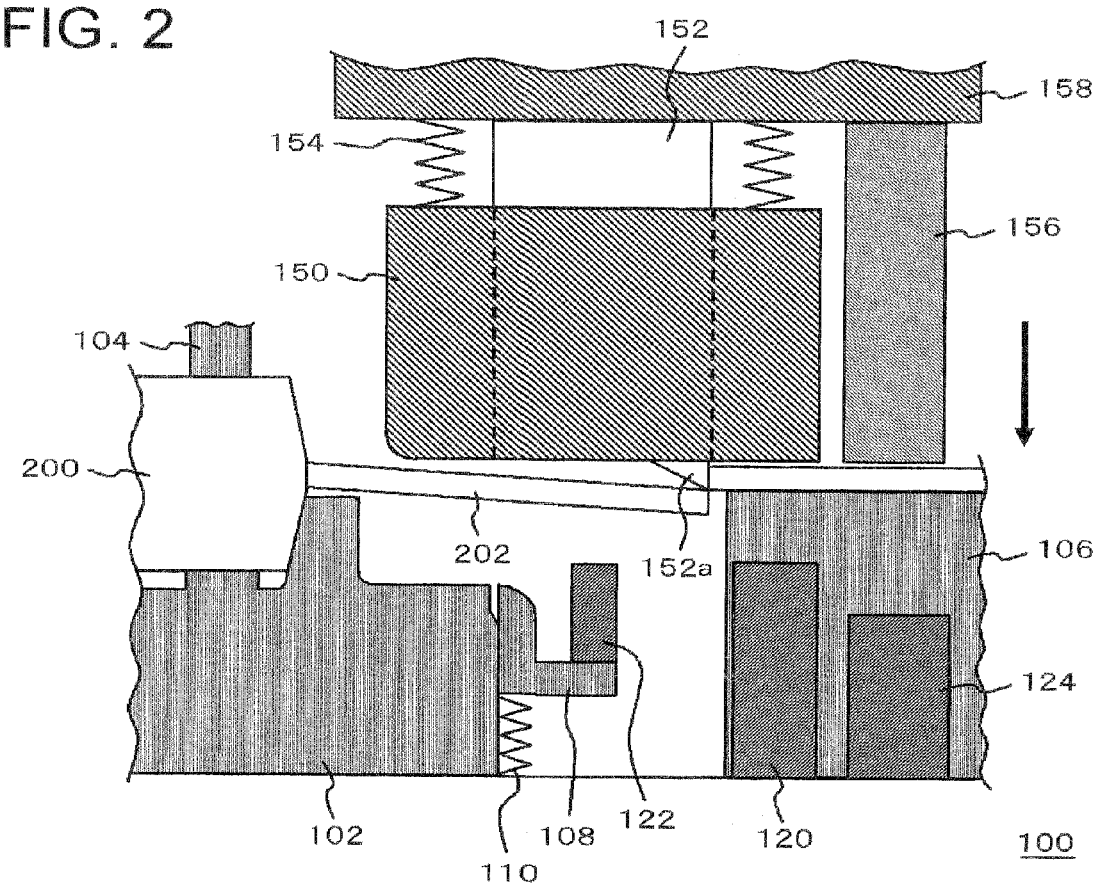

With the state described above, when the upper die base 158 is moved vertically down towards the lower die, the lead cutting punch 152 and the lead bending punch 150 also descend in synchronization with the upper die base 158. First, the acute-angled portion 152a of the lead cutting punch 152 comes into contact with the leads 202. When the upper die base 158 further descends, the leads 202 are cut, and thereby the semiconductor device 200 is separated from the lead frame (FIG. 2).

When the upper die base 158 further descends, the leads 202 are pressed to bend by the lead bending punch 150, so as to effect bending the leads 202. Although the lead cutting punch 152 is vertically movable independently from the lead bending punch 150, it descends in synchronization therewith until the bending of the leads 202 is completed.

Figure 7:
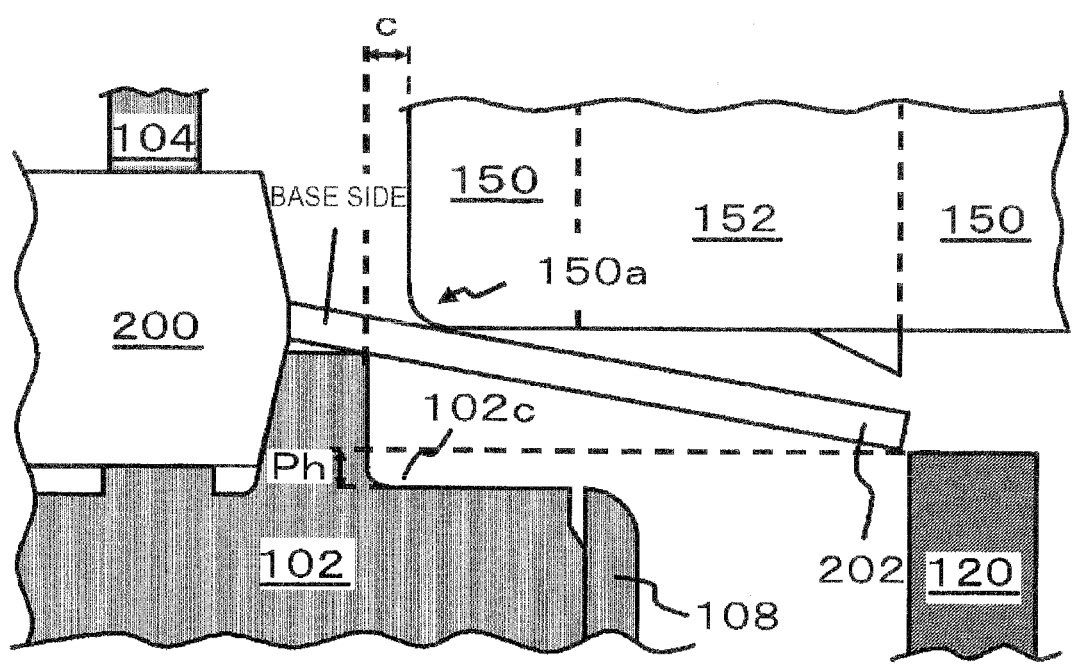
FIG. 7 to FIG. 9 are side elevations schematically showing a configuration of the lead forming apparatus in the process of bending the leads.
Figure 8:
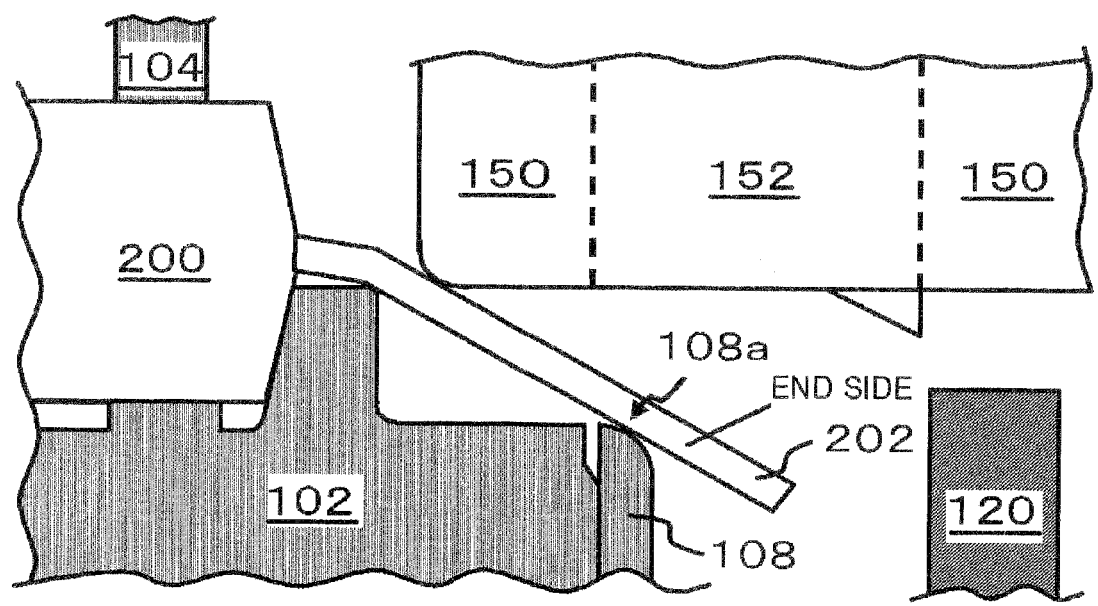
Figure 9:
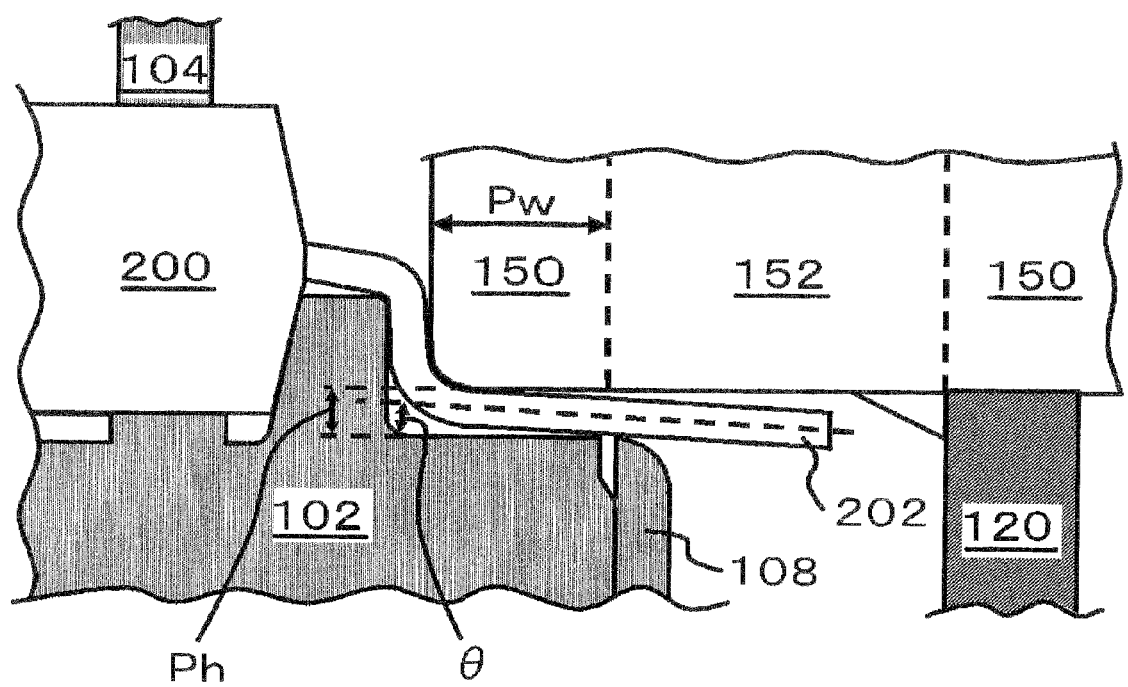

The process of bending the leads 202 will be explained referring to FIG. 7 to FIG. 9. FIG. 7 to FIG. 9 show only a portion essential for the explanation, for the sake of simplicity.

As shown in FIG. 7, the lead bending punch 150 has a round portion 150a at the corner shown as the left lower portion thereof in the drawing. R-value of the round portion 150a of the lead bending punch 150 may appropriately be set typically in the range from 0.05 mm or larger and 0.25 mm or smaller. The R-value herein means radius of curvature. The first lead bending die 102 has a notched portion 102c accepting the round portion 150a of the lead bending punch 150. Distance "c" between the side face of the notched portion 102c of the first lead bending die 102 and the side face of the lead bending punch 150 facing to the side face of the notched portion 102c may be determined to as wide as being larger than the thickness of the leads 202. FIG. 7 shows a state at the beginning of the bending of leads. First, the round portion 150a of the lead bending punch 150 comes into contact with the base portion of the leads 202, thereby the leads 202 are pressed down by the lead bending punch 150.

The leads 202 then bend, on the base side, around a support point which corresponds to the portion of contact thereof with the first lead bending die 102, and then come into contact, on the end side as shown in FIG. 8, with the round portion 108a of the second lead bending die 108 shown as the right upper portion thereof in the drawing. R-value of the round portion 108a of the second lead bending die 108 may appropriately be set depending on geometry of products, typically in the range from 0.3 mm or larger and 0.7 mm or smaller. The R-value of the round portion 108a of the second lead bending die 108 may be set so as to possibly minimize sliding between the bottom surface of the ends of leads and the second lead bending die 108 in the process of the bending of leads. By reducing the sliding, peeling of solder plating of the semiconductor device due to friction caused by processes, and deposition of solder debris onto the second lead bending die 108 may be suppressed. For the case of adopting solder plating relatively high in hardness, and being supposedly less causative of peeling of solder plating or deposition of solder debris, such as palladium-base plating or tin plating, a standard of the R-value may be determined at around 0.5 mm for example.

Thereafter, the leads 202 are bent and processed as the lead bending punch 150 descends. In the process of bending leads, the leads are constantly brought into point contact, on the bottom surface of the ends thereof, with the round portion 108a of the second lead bending die 108 while assuming themselves as tangential lines, wherein the points of contact shift as the bending proceeds.

The lead bending punch 150 further descends, comes into contact with the first stopper 120, and stops at a predetermined position (FIG. 9). In other words, the bottom dead center of the lead bending punch 150 in this embodiment is determined by the first stoppers 120. By virtue of this configuration, the leads 202 may be bent without being clamped between the lead bending punch 150 and the first lead bending die 102.

In the conventional method of bending characterized by clamping of the leads, any geometrical and dimensional modification of the leads have required re-designing of the upper die component and the lower die component clamping the leads, so that very long time for manufacturing and huge cost have been necessary.

Figure 3:
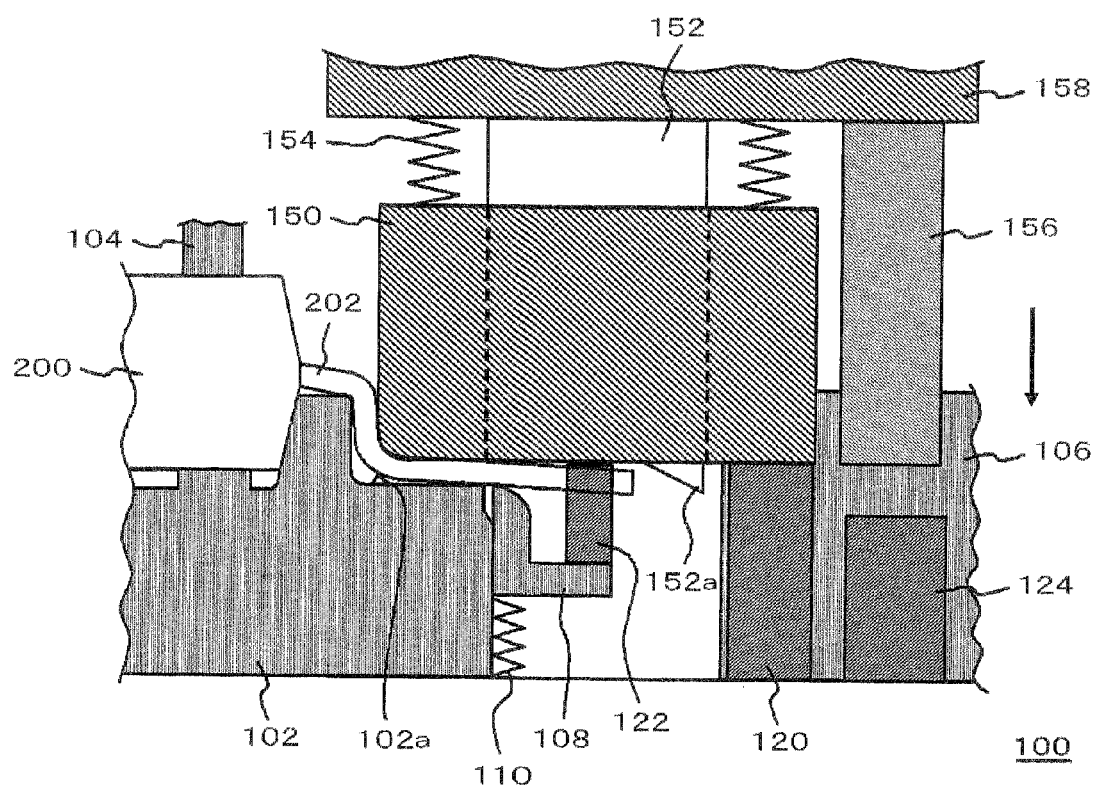

In contrast, this embodiment is designed as ensuring a gap between the leads 202 and the lead bending punch 150, and between the leads 202 and the first lead bending die 102, at the position of the bottom dead center of the lead bending punch 150, so as to avoid clamping of the leads 202 in the process of bending. Because the bending of leads is carried out without clamping the leads 202, geometry of leads and angle of flatness θ of leads may readily be adjustable, simply by altering the stop position of descending Ph of the lead bending punch 150 through adjusting height of the first stoppers 120. Here, the angle of flatness means the angle between the horizontal plane and the edges of the leads 202. The configuration may also reduce the area of contact of the leads 202 with the lead bending punch 150 and with the first lead bending die 102, and may prevent scratching or peeling of the solder plated surface of the leads 202. FIG. 3 is a drawing showing a state of completion of the bending of the leads by which the leads 202 are formed into the gull wing shape as described in the above.

Figure 4:
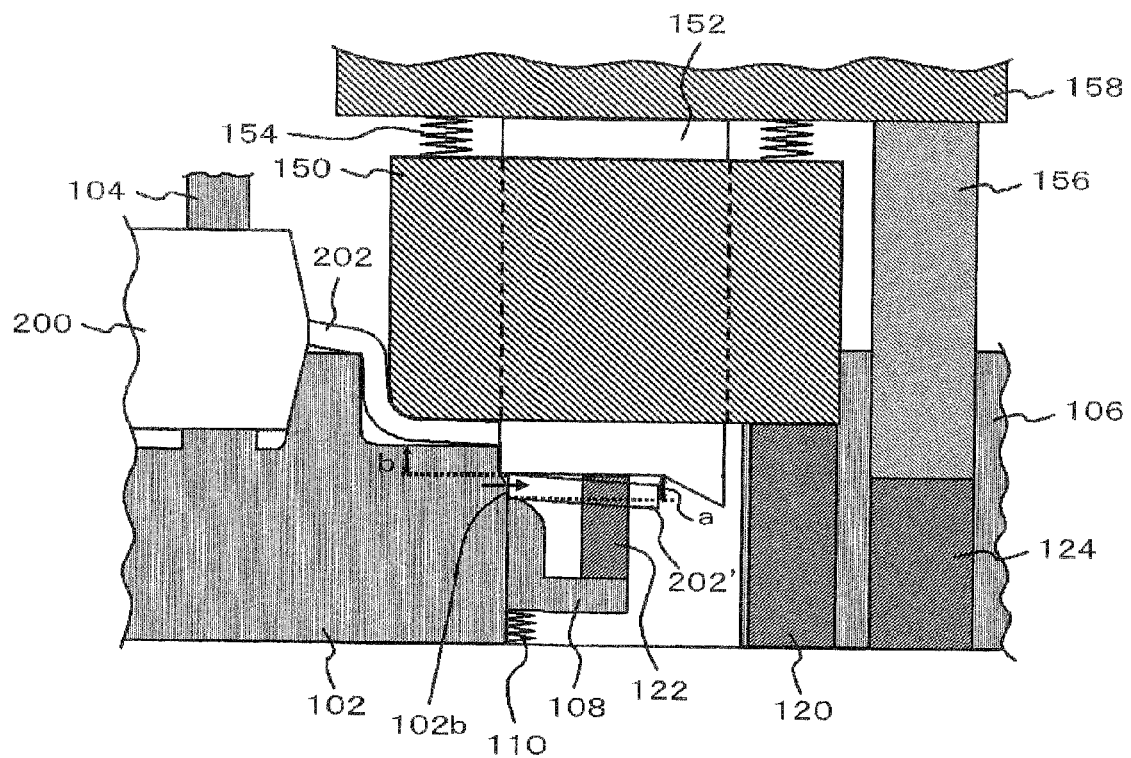

When the upper die base 158 is further descended after the lead bending punch 150 reached the bottom dead center and stopped there as shown in FIG. 4, the lead cutting punch 152 and the fourth stoppers 156 further descend, while keeping the position of the lead bending punch 150 at the bottom dead center by contribution of contracted second springs 154.

In this process, first the bottom surface of the lead cutting punch 152 comes into contact with the second stoppers 122. Further descent of the upper die base 158 makes the second stoppers 122 and the second lead bending die 108 descend, as being pressed down by the lead cutting punch 152. In this process, the lead cutting punch 152 descends while keeping a predetermined distance "a" in relation to the second lead bending die 108. The predetermined distance "a" may be adjustable depending on the level of height of the second stopper 122 relative to the level of height of the top surface of the second lead bending die 108. In other words, difference between the levels of height of the top surface of the second lead bending die 108 and the second stopper 122 is given as the predetermined distance "a". The predetermined distance "a" may be given as being nearly equal to the thickness of the leads 202.

When the lead cutting punch 152 further descends, the ends of the leads 202 are cut. At this point of time, chips 202' of the leads 202 are held between the second lead bending die 108 and the lead cutting punch 152, kept underneath the lead cutting punch 152, and thereby prevented from being scattered into the lead forming apparatus 100. When the lead cutting punch 152 further descends, also the chips 202' of the leads 202 descend while being held between the lead cutting punch 152 and the second lead bending die 108.

Figure 5:
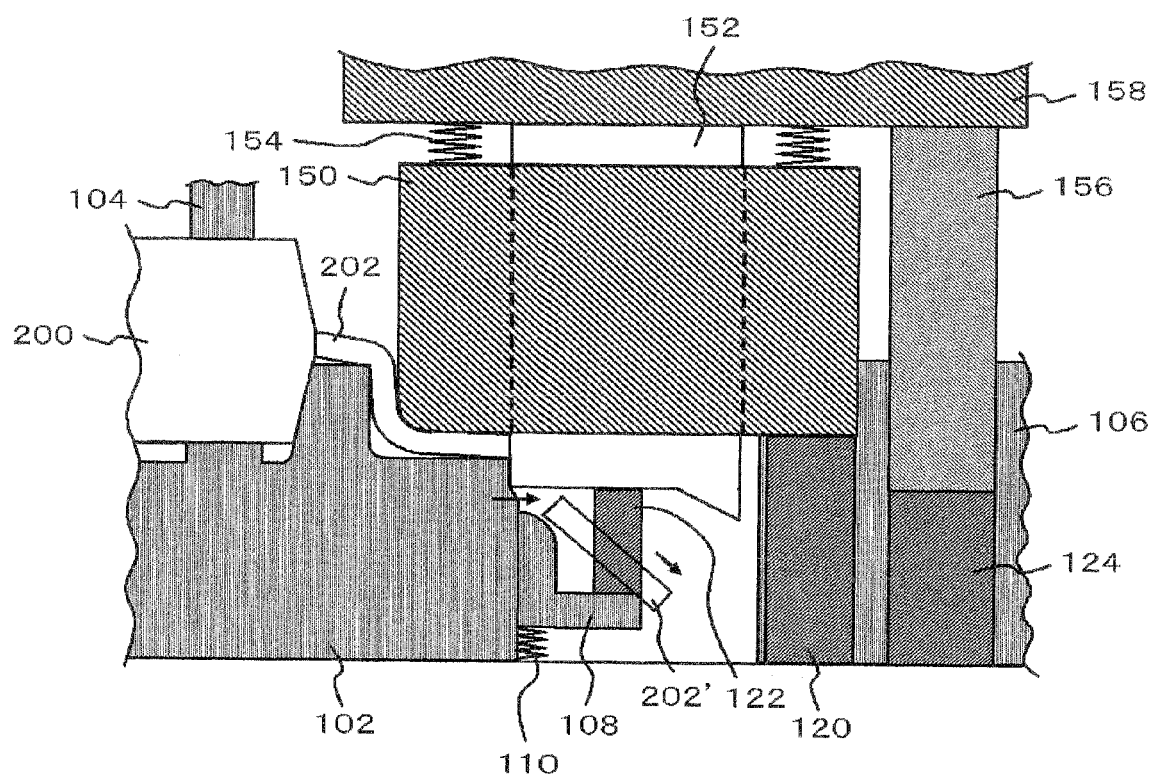

In this embodiment, the first lead bending die 102 has, on the side face thereof facing to the second lead bending die 108 or the lead cutting punch 152, an inclined portion 102a gradually widened downwards as being originated from a position downwardly away from the top surface of the lead bending portion 102a by a predetermined distance "b". The distance "b" between the top surface of the lead bending portion 102a and the point of origin of the inclined portion 102b may be given typically as being not larger than the thickness of the leads. When the lead cutting punch 152 descends and the chips 202' reach the inclined portion, the chips 202' are pushed out in the horizontal direction towards the lead frame side, as indicated by the arrow in the drawing, and discharged (FIG. 5). In this way, the chips 202' may surely be discharged and removed, without remaining inside the lead forming apparatus 100.

The third stoppers 124 determine the bottom dead center of the lead cutting punch 152. The upper die base 158 stops when the fourth stoppers 156 reach the third stoppers 124. The lead cutting punch 152 stops just before the point of origin of the inclined portion 102b of the first lead bending die 102. When the bottom surface of the lead cutting punch 152, excluding the acute-angled portion 152a, and the bottom surface of the fourth stoppers 156 are aligned at the same level of height, the point of origin of the inclined portion 102b of the first lead bending die 102 and the top surface of the third stopper 124 may be aligned at the same level of height.

As has been described in the above, according to the lead forming apparatus 100 of this embodiment, a mechanism of adjusting the bottom dead center of the lead bending punch 150 is provided, so as to make the lead bending punch 150 stop at the bottom dead center, which is a position not causative of clamping of the leads 202, in the process of bending leads, and thereby the leads 202 are formed. The position of the bottom dead center of the lead bending punch 150 may arbitrarily be altered, by appropriately setting the level of height of the first stoppers 120. As a consequence, according to this embodiment, the geometry of leads represented by angle of flatness of leads may readily be adjustable and modifiable, without newly manufacturing nor exchanging die components (punches and dies). The configuration may also reduce the area of contact of the leads 202 with the lead bending punch 150 and with the first lead bending die 102, and may prevent scratching or peeling of the solder plated surface of the leads 202.

Provision of the mechanism of discharging the separated chips 202' still also successfully avoids residence and scattering of chips inside the die.

In this way, improvement in quality of the products, prevention of fracture of the die, cost reduction for the die components and so forth may be ensured, while carrying out a series of processes in a single apparatus.

Figure 10:
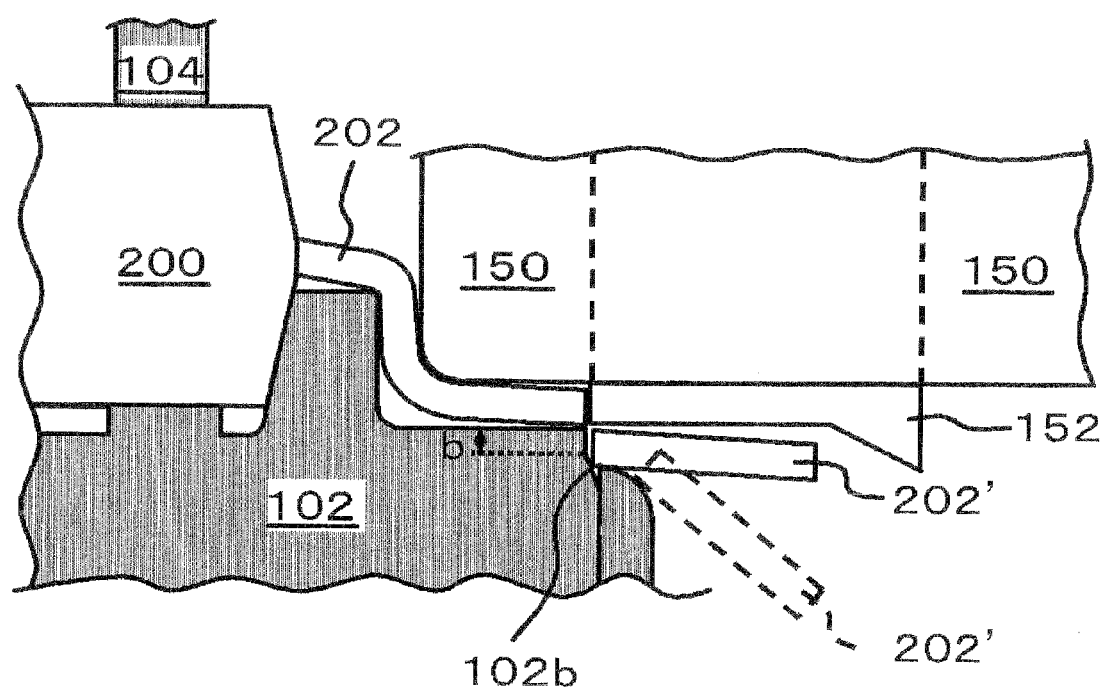
FIG. 10 is a side elevation schematically showing another exemplary configuration of the lead forming apparatus in one embodiment of the present invention.

FIG. 10 is a sectional view showing a configuration according to a modified example of the lead forming apparatus 100 explained referring to FIG. 1 to FIG. 9.

The modified example is different from that shown in FIG. 4 in the position of the point of origin of the inclined portion 102b provided to the first lead bending die 102 on the side face thereof facing to the second lead bending die 108. More specifically, in this example, the distance "b" between the top surface of the lead bending portion 102a to the point of origin of the inclined portion is shorter than that shown in FIG. 4.

Flashes possibly produced at the portion of cutting of the ends of leads 202 in the process of cutting the ends of leads 202 are generally believed as being a causal factor of degrading solderability in the process of mounting the semiconductor device 200. In this embodiment, the chips 202' of the leads 202 begin to be pushed out in the horizontal direction upon contact with the inclined portion 102b, in the middle course of cutting of the leads 202. By virtue of this configuration, the flashes generally produced at the portion of cutting of the ends of leads 202 so as to extend downward may be extended in the horizontal direction, and thereby the solderability of the semiconductor device 200 in the process of mounting may be improved. Timing when the chips 202' are begun to be pushed in the horizontal direction upon contact with the inclined portion 102b may preferably be adjusted to a point of time when the cutting surface of the leads 202 switches over from shear surface to fracture surface. However, in a strict sense, the point may be susceptible to only a slight fluctuation in the clearance of cutting.

Assuming now, for example, ratio of the shear surface and the fracture surface as 5:5, the timing may be adjustable to the point of time when the cutting surface of the leads 202 switches over from shear surface to fracture surface, by allowing the leads 202 destined for producing the chips 202' to begin to slide on the inclined portion, only after the lead cutting punch 152 descends to as deep as half-thickness of the leads 202. In order to achieve such timing, the distance "b" in this example may typically be adjusted to approximately half of the thickness of the leads 202. In this way, the chip 202' may begin to slide on the inclined portion 102b, only after the lead cutting punch 152 reaches the half-thickness of the leads 202. This configuration may improve the solderability of the ends of the leads 202.

Second Embodiment

Figure 11:
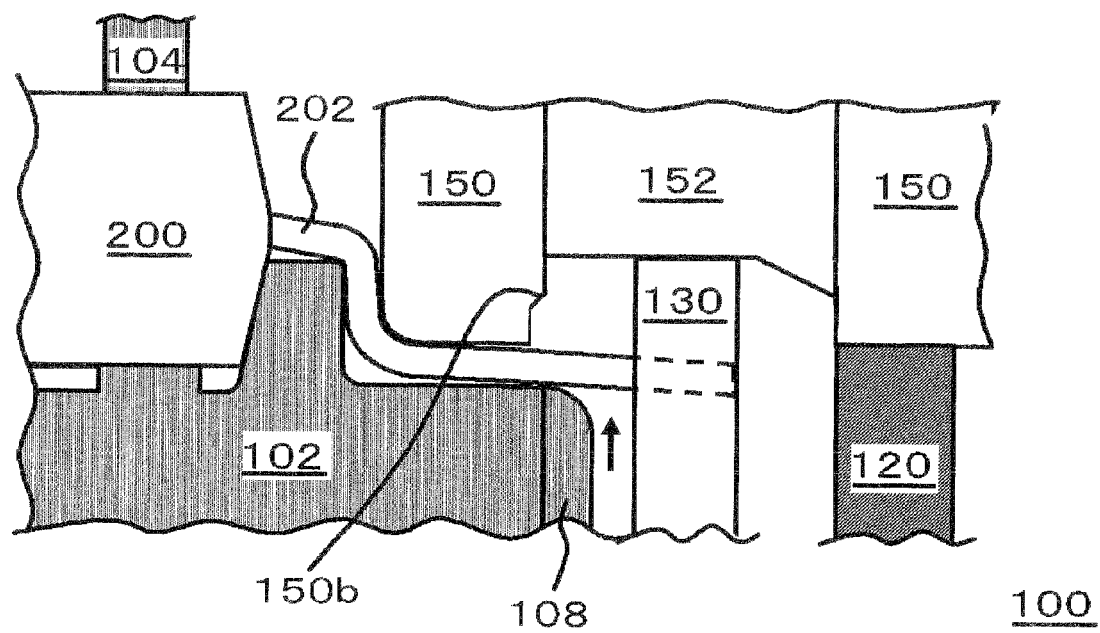
FIG. 11 to FIG. 15 are side elevations schematically showing a configuration of a lead forming apparatus in another embodiment of the present invention.

FIG. 11 is a sectional view schematically showing a configuration of the lead forming apparatus 100 of this embodiment.

This embodiment differs from the first embodiment in that the second lead bending die 108 is configured as being movable vertically upward from the initial state, and consequently in that the ends of the leads 202 are cut in the process of cutting and removing the ends of the leads 202 by ascending the second lead bending die 108. The lead bending punch 150 in this embodiment has, on the side face thereof facing to the second lead bending die 108, an inclined portion 150b gradually widened upwards as being originated from a position upwardly away from the bottom surface of the lead bending punch 150 by a predetermined distance. The predetermined distance between the bottom surface of the lead bending punch 150 to the point of origin of the inclined portion 150b may be set similarly to the distance "b" between the top surface of the lead bending portion 102 of the first lead bending die 102 and the point of origin of the inclined portion 102b described in the first embodiment.

According to the configuration of this embodiment, flashes may be allowed to extend upward, counter to the surface of mounting of the semiconductor device 200, by using the second lead bending die 108 as a cutting punch and by cutting the leads 202 from below, and thereby the solderability in the process of mounting of the semiconductor device 200 may be improved.

In this embodiment, the lead cutting punch 152 stops descending, after completion of the cutting of leads 202 and separating of the semiconductor device 200 form the lead frame. The lead forming apparatus 100 may further include stoppers 130 for stopping the descent of the lead cutting punch 152. In order to reduce impact possibly applied to the lead cutting punch 152 when it is stopped by the stoppers, the lead cutting punch 152 in this embodiment are hung down from the upper die base 158 using a plurality of sliding components (not shown) similarly to the lead bending punch 150, so as to allow vertical sliding in a precise manner. Springs, such as those similar to the second springs 154, may further be provided between the lead cutting punch 152 and the upper die base 158. The lead forming apparatus 100 of this embodiment may be configured without the second stoppers 122 (see FIG. 1).

In this configuration, when the upper die base 158 is further descended, after the leads 202 are separated from the lead frame using the acute-angled portion 152a of the lead cutting punch 152, while keeping the lead cutting punch 152 stopped, the lead bending punch 150 further descends, while again keeping the lead cutting punch 152 at the fixed position by virtue of contraction of the springs between the lead cutting punch 152 and the upper die base 158. The lead bending punch 150 is then further descended until it is stopped by the first stoppers 120, similarly to as explained in the first embodiment. The bending of the leads 202 may be accomplished in this way. The resultant state is shown in FIG. 11.

Figure 12:
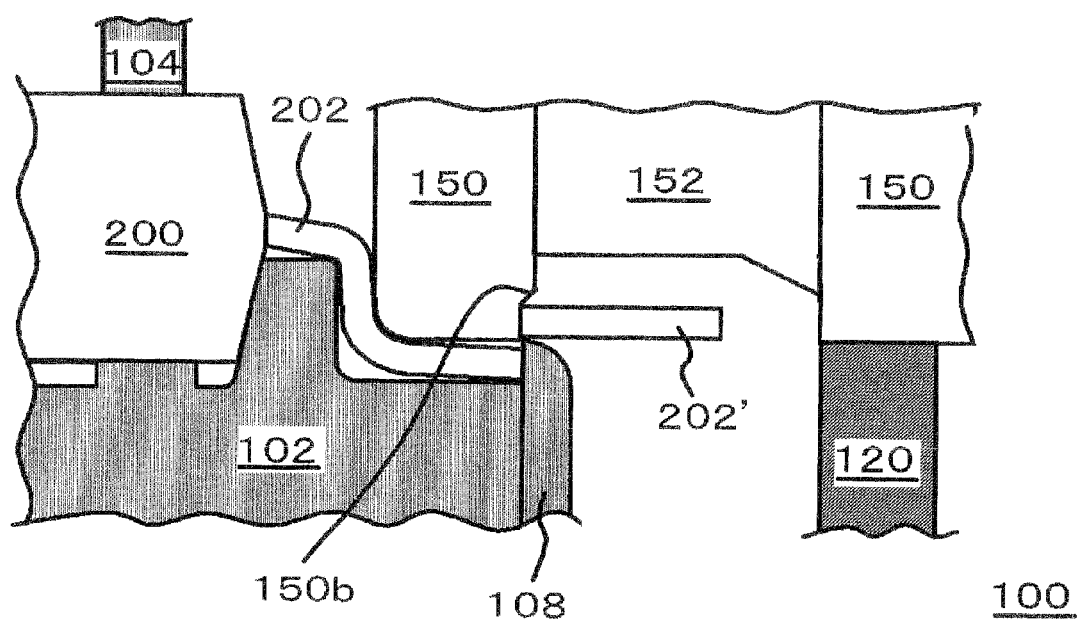
Figure 13:
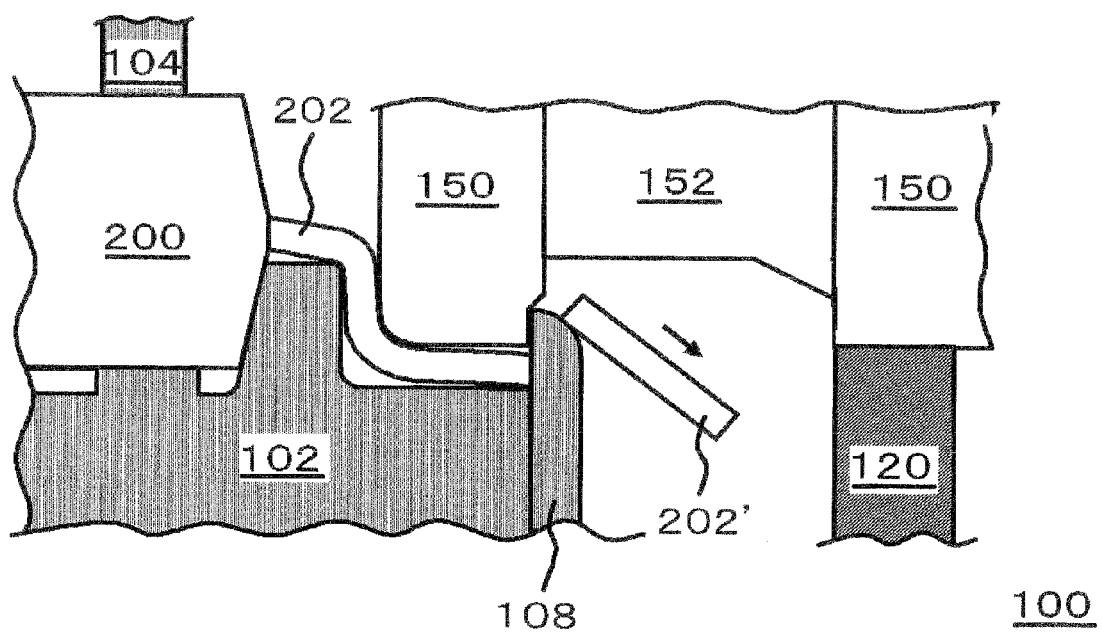

The cutting of the ends of leads 202 is proceeded by the second lead bending die 108 ascended thereafter (FIG. 12). At this point of time, chips 202' of the leads 202 are kept underneath the lead cutting punch 152, and thereby prevented from being scattered into the lead forming apparatus 100. When the second lead bending die 108 further ascends, the chips 202' are pushed out in the horizontal direction by the inclined portion 150b provided to the side face of the lead bending punch 150, and then drop by their own weight. The second lead bending die 108 stops when the end portion thereof comes just in front of the point of origin of the inclined portion 150b (FIG. 13).

Figure 14:
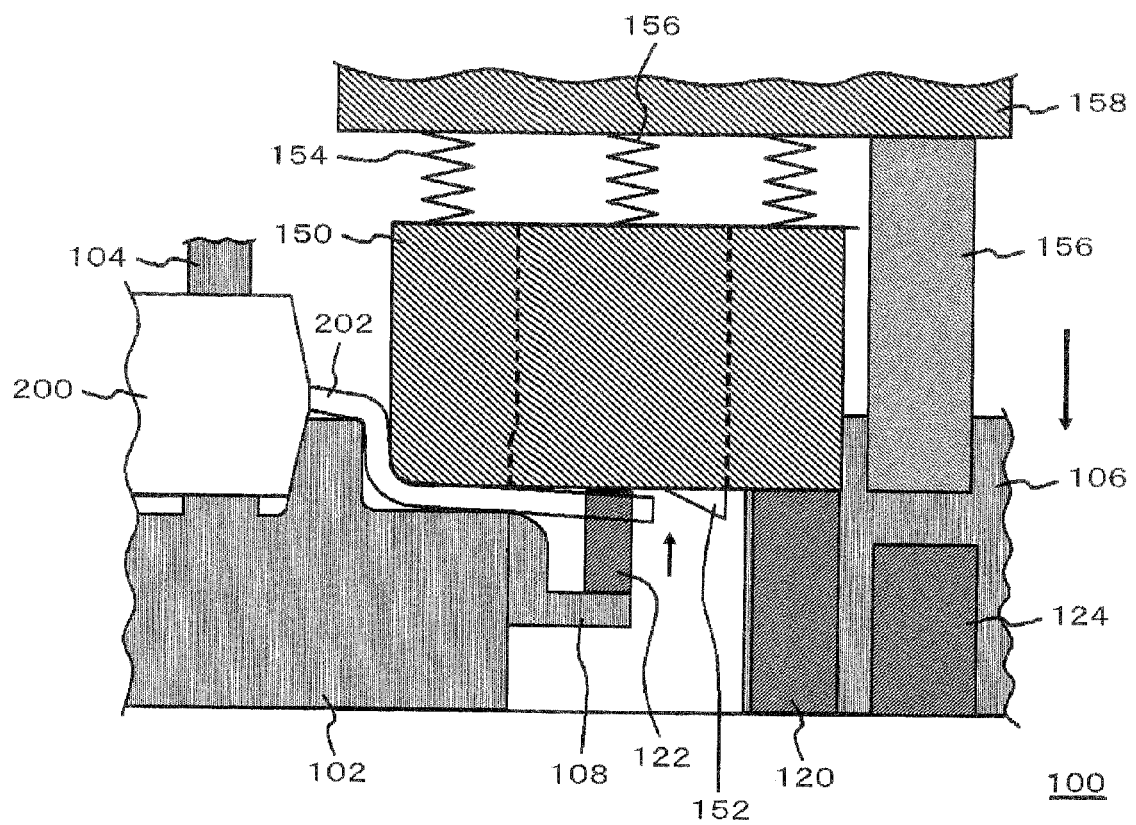

FIG. 14 is a side elevation showing another example of the lead forming apparatus 100 in this embodiment.

Also in this example, the second lead bending die 108 is used as a cutting punch. The lead forming apparatus 100 in this example may be configured as having the second stoppers 122, similarly to as explained in the first embodiment. The lead cutting punch 152 descends in synchronization with the lead bending punch 150, even after completion of the cutting and separating of the leads 202, so as to perform the bending of the leads. Thereafter, the descent of the lead bending punch 150 is stopped by the first stoppers 120, and also the descent of the lead cutting punch 152 is stopped by the second stoppers 122.

Figure 15:
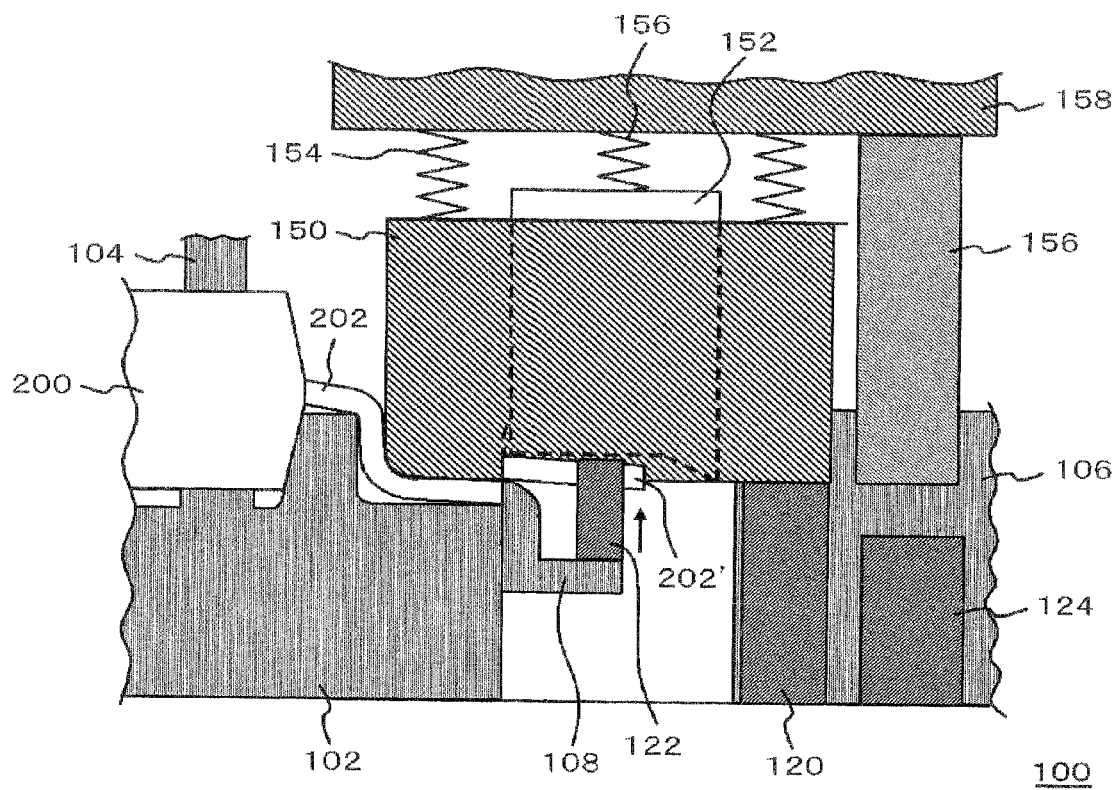

Next, the end of the leads 202 are cut by ascending the second lead bending die 108 (FIG. 15). At this point of time, the chip 202' of the leads 202 are held between the second lead bending die 108 and the lead cutting punch 152, and kept underneath the lead cutting punch 152, and thereby prevented from being scattered into the lead forming apparatus 100. When the second lead bending die 108 further ascends, the lead cutting punch 152 is pushed up while keeping a predetermined distance between itself and the second lead bending die 108, by contribution of the second stoppers 122. In this process, also the chips 202' of the leads 202 ascend while being held between the lead cutting punch 152 and the second lead bending die 108. After the lead bending punch 150 reaches the inclined portion, the chips 202' are pushed out in the horizontal direction, and discharged.

The embodiments of the present invention have been described in the above referring to the attached drawings, merely as examples of the present invention, while allowing adoption of various configurations other than those described in the above.

Although not shown in the drawings, the movable components of the dies and punches are configured as movable by a mechanism such as a guide. The stoppers including the first stoppers 120 and the third stoppers 124 may be configured by those having strength (geometry) enough for determining the stop position of the bottom dead center and for satisfying accuracy of stopping. These stoppers may be shaped and arranged so as not to apply any unbalanced load or stress to the movable components such as punches and dies. In addition, the stopper surfaces of these stoppers, and contact surfaces of the upper die correspondent to these stoppers may be horizontal and smooth. These stoppers may also be configured as a set of block gauges, step-wisely varied in the height according to a pitch typically as small as 5 to 10 μm, allowing adjustment of height simply by exchanging them. Each of these stoppers may be composed of a plurality of components, and may be fixed using screws. While the punches and the dies need highly sophisticated and precise machining, the stoppers need precision of machining of a single dimension only in the height-wise direction, so that the machining may considerably be facilitated and made inexpensive. The lead forming apparatus of this embodiment can set various geometries of the leads only by a simple machining.

Also the geometry of the lead bending punch 150 covering the range corresponded to the length of portions of leads removed as the chips 202', the predetermined distance "a" kept between the lead bending punch 150 and the second lead bending die 108 in the process of synchronous movement, the angle of the inclined portion 102b or the inclined portion 150b provided to the side face of the first lead bending die 102 or the lead bending punch 150, and so forth, may appropriately be set or modified, so as to obtain optimum geometry and dimension, depending on the geometry of the leads 202 of the semiconductor device 200 and other conditions.

In addition, length of the flat portions of the leads 202, explained referring to FIGS. 16A and 16B and FIGS. 17A and 17B, may be modified by altering the width Pw (see FIG. 9) of the lead bending punch 150. The geometry and dimension of the leads may freely be adjustable, without modifying the geometry of the first lead bending die 102, simply by altering the stop position Ph of the descending lead bending punch 150 by adjusting the height of the first stoppers 120, and by altering the width Pw of the lead bending punch 150.

In addition to above, according to the present invention, there is provided also a method of forming leads comprising descending a lead bending punch, as an upper die, towards a lead bending die, as an lower die, so as to move leads of a semiconductor device having the leads towards the lead bending die, to thereby bend the leads into a gull wing shape, wherein in the descending a lead bending punch, the bottom dead center of the lead bending punch is specified so as to ensure distance not smaller than thickness of the leads, between the bottom surface of the lead bending punch and the top surface of a portion, allowing thereon placement of the leads, of the lead bending die.

The method of forming leads may further includes:
separating the semiconductor device from a lead frame using the lead cutting punch, before the bending leads; and
cutting the ends of the leads, after the bending leads.

It is apparent that the present invention is not limited to the above embodiment, that may be modified and changed without departing from the scope and spirit of the invention.

What is claimed is:

1. A method of fabricating a semiconductor device having a plurality of leads comprising:
descending a lead bending punch, as an upper die, towards a lead bending die, as an lower die, so as to move said leads of said semiconductor device towards said lead bending die, to thereby bend said leads into a gull wing shape,
wherein, in descending the lead bending punch, a first stopper specifies the bottom dead center of said lead bending punch so as to ensure distance not smaller than thickness of said leads, between the bottom surface of said lead bending punch and the top surface of a portion, allowing thereon placement of said leads, of said lead bending die,
wherein said lead bending die includes:
a first lead bending die allowing thereon placement of a main body of said semiconductor device, and having a curved surface facing towards said lead bending punch in bending said leads; and
a second lead bending die is movable in the same direction with the direction of movement of said lead bending punch, and having a round portion allowing contact with an end side of said leads bent as being brought into contact with said lead bending punch in bending said leads.

2. The method of fabricating the semiconductor device as claimed in claim 1, further comprising:
separating said semiconductor device from a lead frame using a lead cutting punch, before bending said leads; and
cutting the ends of said leads by said lead cutting punch so as to adjust said leads to a specified dimension, after bending said leads.

3. The method of fabricating the semiconductor device as claimed in claim 2,
wherein said lead cutting punch is moveable independently from said lead bending punch, in the same direction with the direction of movement of said lead bending punch.

4. The method of fabricating the semiconductor device as claimed in claim 3, wherein a second stopper keeps distance between said second lead bending die and said lead cutting punch, so that said second lead bending die and said lead cutting punch can synchronously move while keeping a predetermined distance in between after said lead bending punch reaches said bottom dead center.

5. The method of fabricating the semiconductor device as claimed in claim 4, wherein said predetermined distance between said second lead bending die and said lead cutting punch equals to thickness of said leads.

6. The lead forming apparatus as claimed in claim 4, wherein a second stopper specifies the bottom dead center of said lead cutting punch.

7. The method of fabricating the semiconductor device as claimed in claim 3, wherein said lead cutting punch descends, in cutting the ends of said leads, to cut the ends of said leads while using a corner portion of said first lead bending die as a cutting edge, and said first lead bending die has, on a side face thereof facing to said lead cutting punch, an inclined portion gradually widened downwards as being originated from a position downwardly away from said corner portion by a predetermined distance.

8. The method of fabricating the semiconductor device as claimed in claim 3, wherein said second lead bending die ascends, in cutting the ends of said leads, to cut the ends of said leads while using a corner portion of said lead bending punch as a cutting edge, and said lead bending punch has, on a side face thereof facing to said second lead bending die, an inclined portion gradually widened upwards as being originated from a position upwardly away from said corner portion by a predetermined distance.

9. The method of fabricating the semiconductor device as claimed in claim 3, wherein a third stopper specifies the bottom dead center of said lead cutting punch.

10. The method of fabricating the semiconductor device as claimed in claim 3, wherein said lead bending punch has a round portion being brought into contact with said leads in said bending leads, said round portion of said lead bending punch having an R-value of 0.05 mm to 0.25 mm.

11. The method of fabricating the semiconductor device as claimed in claim 1, wherein said round portion of said second lead bending die has an R-value of 0.3 mm to 0.7 mm.

12. The method of fabricating the semiconductor device as claimed in claim 1, wherein said lead bending punch has a round portion being brought into contact with said leads in said bending leads, said round portion of said lead bending punch having an R-value of 0.05 mm to 0.25 mm.

13. The method of fabricating the semiconductor device as claimed in claim 1, wherein said bend in said leads further comprising:

supporting a main body of said semiconductor device on said lead bending die so as to fix said main body by a supporting component.

* * * * *